United States Patent [19]
Garofalo et al.

[11] Patent Number: 5,308,721
[45] Date of Patent: May 3, 1994

[54] SELF-ALIGNED METHOD OF MAKING PHASE-SHIFTING LITHOGRAHIC MASKS HAVING THREE OR MORE PHASE-SHIFTS

[75] Inventors: Joseph G. Garofalo, South Orange; Christophe Pierrat, Basking Ridge, both of N.J.

[73] Assignee: AT&T Bell Laboratories, Murray Hill, N.J.

[21] Appl. No.: 906,070

[22] Filed: Jun. 29, 1992

[51] Int. Cl.[5] .......................... G03F 9/00; G03C 5/00
[52] U.S. Cl. ........................................ 430/5; 430/322; 430/323; 430/324; 430/313; 430/316
[58] Field of Search ............... 430/5, 322, 316, 313, 430/324, 396, 323

[56] References Cited

U.S. PATENT DOCUMENTS 5,153,083 10/1992 Garofalo et al. ................. 430/5

OTHER PUBLICATIONS

Ohtsuka, H. et al., "Conjugate Twin-Shifter for the New Phase Shift Method to High Resolution Lithography," SPIE (Society of Photo-Optical Instrumentation Engineers), the Int. Soc. Optical Engineers, Proc. of Optical/Laser Microlithography IV, pp. 112–123 (Mar. 6–8, 1991).

Watanabe, H. et al., "Transparent Phase Shifting Mask with Multistage Phase Shifter and Comb-shaped Shifter," same as above, pp. 101–110.

*Primary Examiner*—Steve Rosasco
*Attorney, Agent, or Firm*—David I. Caplan

[57] ABSTRACT

A phase-shifting lithographic mask having two or more self-aligned phase-shifting regions is fabricated by a sequence of etchings of the phase-shifting mask using a protective resist layer having three or more regions that have been subjected to mutually different doses (including possibly zero) of actinic radiation-such as electron beam, ion beam, or photon beam radiation. A self-aligned opaque region can be supplied by carbonization of remaining resist material.

22 Claims, 5 Drawing Sheets

SELF-ALIGNED METHOD OF MAKING PHASE-SHIFTING LITHOGRAHIC MASKS HAVING THREE OR MORE PHASE-SHIFTS

TECHNICAL FIELD

This invention relates to optical lithography, such as that used for fabricating semiconductor integrated circuit and other devices. More particularly the invention relates to methods of making phase-shifting masks, for use in optical systems for lithographically fabricating such devices. These masks are also called "reticles" particularly when used in optical systems having magnifications different from unity.

BACKGROUND OF THE INVENTION

FIG. 1 shows a typical optical lithographic fabrication system 100 for delineating features in a workpiece 120. Typically the workpiece comprises a semiconductor wafer (substrate), together with one or more layers of material(s) (not shown) located on a top major surface of the water. More specially, monochromatic optical radiation of wavelength $\lambda$ emitted by an optical source 106, such as a mercury lamp, propagates through an aperture in an opaque screen 105, an optical collimating lens 104, a lithographic mask of reticle 103, and an optical focusing lens 102. The optical radiation emanating from the reticle 103 is focused by the lens 102 onto a photoresist layer 101 located on the top major surface of the workpiece 120. Thus, the pattern of the reticle 103—that is, its pattern of transparent and opaque portions—is focused on the photoresist layer 101. Depending upon whether this photoresist is positive or negative, when it is subjected to a development process, typically a wet developer, the material of the photoresist is removed or remains at and only at areas where the optical radiation was incident. Thus, the pattern of the mask is transferred to ("printed on") the photoresist layer 101. Subsequent etching processes, such as wet etching or dry plasma etching, remove selected portions of the workpiece 120. Portions of the workpiece 120 thus are removed from the top surface of the workpiece 120 at areas underlying those where the photoresist layer 101 was removed by the development process but not at areas underlying those regions where the photoresist remains. Alternatively, instead of etching the workpiece, impurity ions can be implanted into the workpiece 120 at areas underlying those where the photoresist layer was removed by the development process but not at areas underlying where the photoresist remains. Thus, the pattern of the mask 103—i.e., each feature of the mask—is transferred to the workpiece 120 as is desired, for example, in the art of semiconductor integrated circuit fabrication.

In fabricating such circuits, it is desirable, for example, to have as many transistors per wafer as possible. Hence, it is desirable to have as small a transistor or other feature size as possible, such as the feature size of a metallization stripe—i.e., its width W—or of an aperture in an insulating layer which is to be filled with metal, in order to form electrical connections, for example, between one level of metallization and other. Thus, for example, if it is desired to print the corresponding isolated feature having a width equal to W on the photoresist layer 101, a feature having a width equal to C must be located on the mask (reticle) 103. According to geometric optics, if this feature of width equal to C is a simple aperture in an opaque layer, then the ratio $W/C = m$, where $m = L2/L1$, and where m is known as the lateral magnification. When diffraction effects become important, however, the edges of the image become indistinct; hence the resolution of the features of the reticle 103, as focused on the photoresist layer and transferred to the workpiece, deteriorates.

In order to improve the resolution, in the prior art phase-shifting lithographic masks have been taught. A phase-shifting mask is used as the mask (or reticle) 103 in the system 100. Moreover, a phase-shifting mask comprises various regions that impart various phase shifts to the optical radiation that originates from the source 106 and propagates through the mask 103 in the system 103. More specifically, these phase-shifting masks have opaque and transparent regions. The transparent regions typically have at least two different thicknesses suitable for imparting at least two different phase shifts, typically 0 and $\pi$ radians, to the optical radiation (of wavelength $\lambda$) propagating through the mask when it is being used as the reticle 103.

For example, as shown in FIG. 2, a phase-shifting mask 200, typically a slab of (optically transparent) quartz, comprises an optically opaque region 201 located at a top surface of the mask. This opaque region 201 is bounded by a pair of edges running parallel to the Y-direction and terminating at say $Y = Y_0$.

The opaque region 201 typically can be supplied by an opaque metallic region. Alternatively, the opaque region 201, it can be supplied by a diffraction grating region that is constructed so as to diffract light away from the zero'th order of the resulting diffraction pattern, and thus the diffraction grating region is equivalent to an opaque region when the mask 200 is used as the reticle 103 in the system 100. Such a diffraction grating region, however, requires a higher resolution than does the remainder (transparent regions) of the mask, whereby undesirably long fabrication times, as well as undesirably stringent geometric tolerances, are required.

The opaque region 201 separates portions of optically transparent regions 210 and 211, which respectively impart phase shifts $\Phi_0$ and $\Phi_1$, typically approximately equal to 0 and $\pi$ radian, respectively. On the other hand, a transparent transition region 212, which is also located between regions 210 and 211, separates other portions of these regions 210 and 211 from each other. This transition region 212 imparts a phase shift that is intermediate $\Phi_0$ and $\Phi_1$, typically approximately $\pi/2$ radian, that of itself does not produce a separate (third) region in the image on the photoresist layer 101 but produces only a transition region in the mask 200. The transition region 212 can also be subdivided, as indicated in phase-shift mask 300 (FIG. 3), into transparent subregions 221 and 222 that impart phase shifts equal to approximately $\pi/3$ and $2\pi/3$ radian, respectively.

When using the mask 200 or 300 as the reticle 103 in the system 100, the optical radiation from the source 106 will be focused as an image on the photoresist layer 102 in such a manner that this image will have a feature running parallel to the Y-direction and terminating along an edge parallel to the X-direction. Thus, after the development process the photoresist layer will be patterned; more specifically, it will have a feature bounded by a pair of parallel edges running parallel to the Y-direction and terminating at say $Y = Y_1$, (not shown) where $Y = Y_1$ is the image of $Y = Y_0$. Finally, the thus patterned photoresist layer can be used to transfer its pattern to the underlying workpiece 120, as by means of ion implantation, or by means of dry or wet etching.

In a paper authored by H. Ohtsuka, et al. entitled "Conjugate Twin-Shifter for the New Phase Shift Method to High Resolution Lithography," published by SPIE (The Society of Photo-Optical Instrumentation Engineers), The International Society for Optical Engineers, in the Proceedings of Optical/Laser Microlithography IV, Vol. 1463, pp. 112–123, (Mar. 6–8, 1991), multiple phase-shifting transparent regions apparently were formed by successive anisotropic etching (successive vertical cuts) to mutually differing depths in a phase-shifting layer. Each of these etchings, however, require a separate alignment step for aligning the boundary edges of the phase-shifting region to be etched with the boundary of edges of a phase-shifting region that has already been etched.

This requirement of separate (multiple) alignment steps has one or more of the following disadvantages. First, formation of alignment marks is required during the first alignment, and these marks must be plated with metal (to remove accumulated electrical charge) so that they can be detected—i.e., their locations can be ascertained—during each of the subsequent alignment steps. This formation, plating, and repeated detection of the alignment marks entails an undesirably large amount of costly effort. Second, each of the etchings requires a separate spinning-on and patterning of a fresh resist layer. Each of the required resist layers undesirably adds to costs of (resist) materials. Third, removal of each resist layer produces particulate matter so that a careful cleaning step is required prior to spinning-on the next resist layer to avoid defects in the mask otherwise caused by this particulate matter. Fourth, development of each resist layer likewise produces particulate matter that locally spoils the etching properties, so that a careful cleaning step is required between each development and etching of a given resist layer. Since any added cleaning steps take time, these cleaning steps undesirably add to processing time and costs. Fifth, any alignment with respect to alignment marks is not as precise as an alignment of a single beam of actinic radiation—that is, a beam of radiation that modifies the development properties of a resist, such as an electron beam, a photon beam, or an ion beam. Although the effects of such misalignment can be avoided by restricting some, if not all, discontinuities in thickness of the transparent material to be located at positions overlying opaque (metallic) material, the kinds of geometries of images that can be handled by the phase-shifting mask when used as the reticle 103 are undesirably limited.

In a paper authored by H. Watanabe et al. entitled "Transparent phase shifting mask with multistage phase shifter and comb-shaped shifter," published by SPIE in the above-mentioned Proceedings at pp. 101–110, multiple phase shifts in a phase-shifting masks were obtained by using the multiple phase shifts produced in a resist layer that had multiple thicknesses. The resist layer was located on a transparent parallel slab. The multiple thicknesses were produced by development of a resist layer, initially of uniform thickness prior to such development, having four regions that had been implanted with four mutually different dose levels (i.e., charge per unit area, one of them equal to zero) of electrons. A disadvantage of this method is that the resist layer is an essential phase-shifting element that remains in the phase-shifting mask. Such a resist layer cannot be repaired easily in case it has defects, is not stable with the passage of time (during subsequent use as the reticle 103 in the system 100), and introduces undesirable optical reflections owing a resulting discontinuity of refractive index at the interface of the resist layer and the underlying transparent slab.

Therefore, it would be desirable to have a method of forming a phase-shifting mask having three or more phase-shifting regions which impart three or more mutually differing respective phase shifts to the optical radiation of wavelength $\lambda$ propagating through mask, but which does not require a separate alignment step between each etching and which does not rely on multiple phase shifting by resist material.

In addition it would be further desirable to have a single-alignment method of forming just two phase-shifting regions—such as regions 210 and 211—that impart two different phase shifts and that are separated by an opaque region, as exemplified by the cut 11—11 shown in FIG. 2. And it would be yet further desirable to have a self-aligned method of forming an opaque region that does not require a diffraction grating.

SUMMARY OF THE INVENTION

This invention involves a self-aligned method for making a phase-shifting mask in which a uniformly thick (original) resist layer of uniform composition, located on the top surface of a body that is transparent with respect to optical radiation of a prescribed wavelength $\lambda$. The body advantageously has a pair of parallel (top and bottom) planar surfaces. In accordance with a first embodiment of the invention (FIGS. 10-11) the resist layer is subjected to at least three mutually different dose levels of actinic radiation in at least three different (hereinafter "first, second, and third") respective regions of the resist layer. Advantageously, thereafter the resist is not subjected to any more actinic radiation. Also, the three dose levels are adjusted so that the resist layer will have three mutually different rates of thickness reduction of the resist layer during a subsequent first treatment thereof.

The resist layer can be either negative tone or positive tone: In cases of a negative tone resist layer, the higher the actinic radiation dose level to which it is subjected, the larger the thickness of the remaining resist layer that remains after subjection to a developing treatment; in case of a positive tone resist layer, the higher the dose level, the smaller the thickness of the remaining resist layer. One of these dose levels—viz., in the first or the third region—advantageously in essentially zero: that is, it does not modify the development property of the region in any substantial or significant way that would undesirably affect the structure of the final mask being made. The resist layer is then developed by means of the first treatment, which reduces the thicknesses of the three regions thereof to three mutually different amounts, advantageously the thickness of the first region of the remaining resist layer thereby being reduced essentially to zero. Next, the remaining resist layer and the top surface of the body are subjected to a second treatment that etches to a predetermined depth a first region of the body underlying the first region of the original resist layer, the thickness of the first region of the resist layer having been reduced essentially to zero—i.e., a thickness that is so small that it does not prevent etching of the first region of the body during the second treatment.

It is further advantageous in this embodiment to subject the remaining resist layer to a third treatment that reduces the thickness of the remaining second region of the resist layer to an amount, advantageously equal to essentially zero, that is less than that of the remaining third region of the resist layer. Still further, it is advantageous to carbonize—and thereby render opaque to the radiation of the source 106—the remaining third region of the remaining resist layer. Alternatively, it is yet further advantageous that, instead of this carbonizing, a second region of the body underlying the second region of the original resist layer, as well as the first region of the body, be subjected to a further etching treatment that etches the first and second regions of the body down to different respective depths beneath the original top surface of the body, and that the remaining third region of the remaining resist layer thereafter be removed, especially if it is so thick as to be undesirably opaque when used as the reticle 103 in the system 100.

It is also advantageous that the third region of the resist layer be contiguous with the first and second regions, and that the first, second, and third dose levels, respectively, be monotonically increasing or monotonically decreasing, depending upon whether the resist is negative tone or positive tone, respectively.

In accordance with a second embodiment of the invention (FIGS. 4–9), the positive or negative tone resist layer is subjected to at least four mutually different dose levels or actinic radiation in four different (hereinafter "first, second, third, and fourth") respective regions of the resist layer. One of the dose levels—viz., the one in the first or fourth regions—advantageously is equal to essentially zero. Advantageously, thereafter the resist is not subjected to any more actinic radiation. Also, the four dose levels are adjusted so that the resist layer will have four mutually different rates of thickness reduction during a subsequent first treatment thereof. The resist layer is then developed by means of the first treatment that reduces the thicknesses of the four regions to mutually different amounts, and in particular to reduce the thickness of the first region to an amount, advantageously equal to essentially zero, that is less than those of the second, third, and fourth regions. Next, the then remaining resist layer and a first region of the body underlying the first region of the original resist layer are subjected to a second treatment that etches the first region of the body down to a predetermined depth beneath its (planar) top surface. Next, the then remaining resist layer is subjected to a third treatment that reduces the thicknesses of the remaining second, third, and fourth regions of the remaining resist layer to mutually different amounts, and in particular that reduces the thickness of the remaining second resist region to an amount, advantageously equal to essentially zero, that is less than those of the then remaining third and fourth regions of the then remaining resist layer. Next, the first region of the body, a second region of the body underlying the second region of the original resist layer, and the then remaining resist layer are subjected to a fourth treatment that etches the first and second regions, respectively, of the body down to prescribed unequal respective depths beneath the top surface of the body.

It is further advantageous in this second embodiment that thereafter the then remaining resist layer be subjected to a fifth treatment that reduces the thickness of the then remaining third region resist layer to an amount, advantageously equal to essentially zero, that is less than that of the then remaining fourth region of the resist region. It is still further advantageous that the then remaining fourth region of the resist layer be rendered permanently opaque to the radiation of the source 106, by means of carbonizing it. Alternatively, it is yet further advantageous that, instead of this carbonizing, a third region of the body underlying the third region of the original resist layer, as well as the first and second regions of the body, be subjected to a further etching treatment that etches the first, second and third regions of the body down to mutually different depths beneath the (original) top surface of the body, and that the remaining fourth region of the resist layer thereafter be removed, especially if it is so thick as to be undesirably opaque. Moreover, it is yet further advantageous that the first region of the original resist layer be contiguous with the second region thereof, that the second region thereof be contiguous with the third, and that the third be contiguous with the fourth—while the first, second, third, and fourth dose levels are monotonically decreasing or increasing, with either the fourth or the first dose level, respectively, advantageously being equal to essentially zero.

At any rate, the phase-shifting mask in accordance with the invention is thus made in a self-aligned manner, that is, without any alignment being required subsequent to the subjection of the resist layer to the actinic radiation. The mask can then be used as the reticle 103 in the above-described system 100. Thus this invention further involves a photolithographic method comprising the steps of (a) forming a phase-shifting mask in accordance with any of the above embodiments of the invention;

(b) directing optical radiation comprising the prescribed wavelength onto the phase-shifting mask, while focusing the radiation propagating through the phase-shifting mask onto a photoresist layer located on a workpiece, whereby an optical image of the mask is formed on the photoresist layer;

(c) developing the photoresist layer, whereby a feature is formed therein in accordance with the image of the mask; and (d) transferring into the workpiece the feature in the photoresist layer.

Only for the sake of clarity, none of the Figures is drawn to any scale.

DETAILED DESCRIPTION

Figure 1:
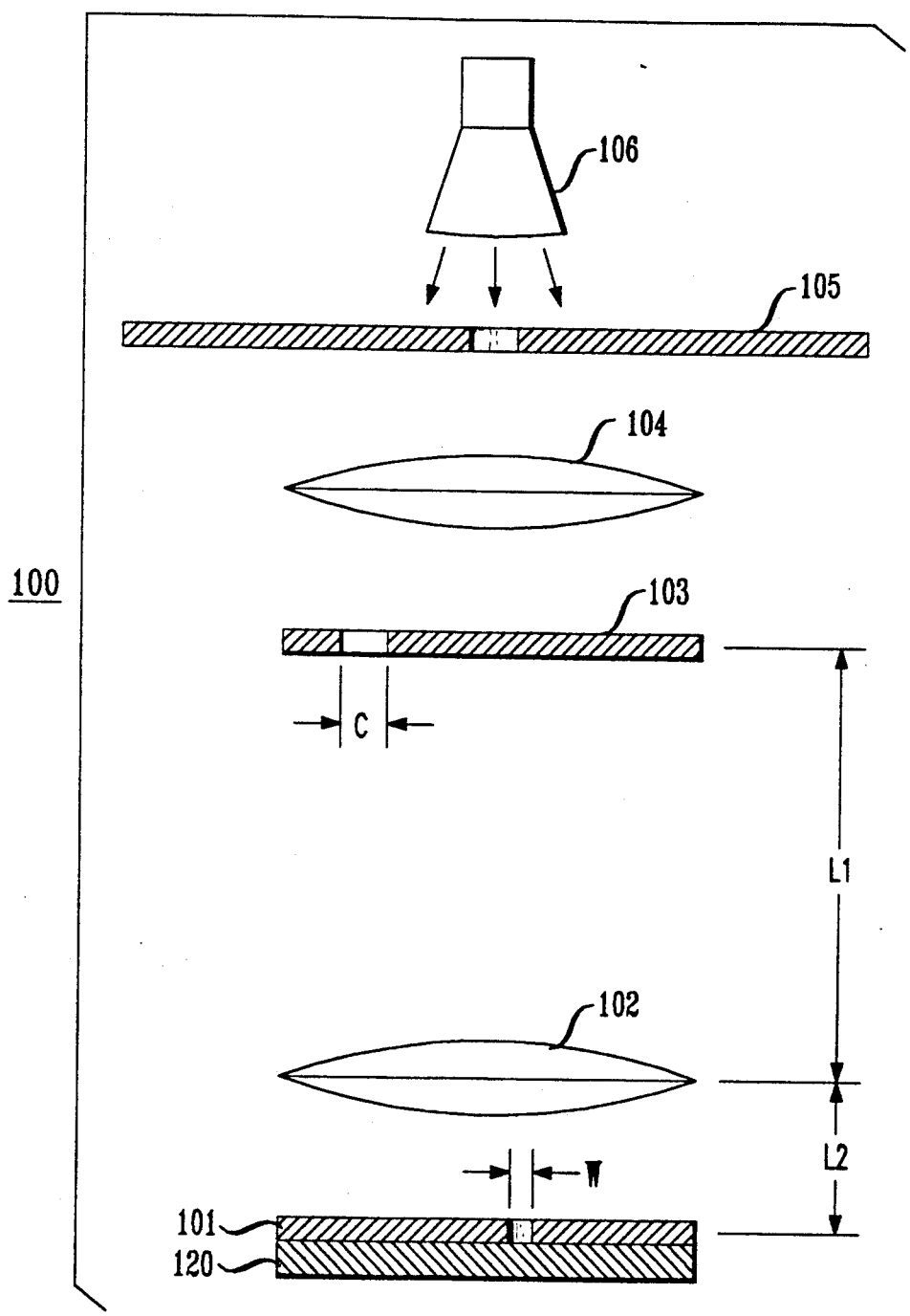
FIG. 1 is a diagram of a typical photolithography system using a phase-shifting mask that has been made in accordance with the prior art or with the invention.
Figure 4:
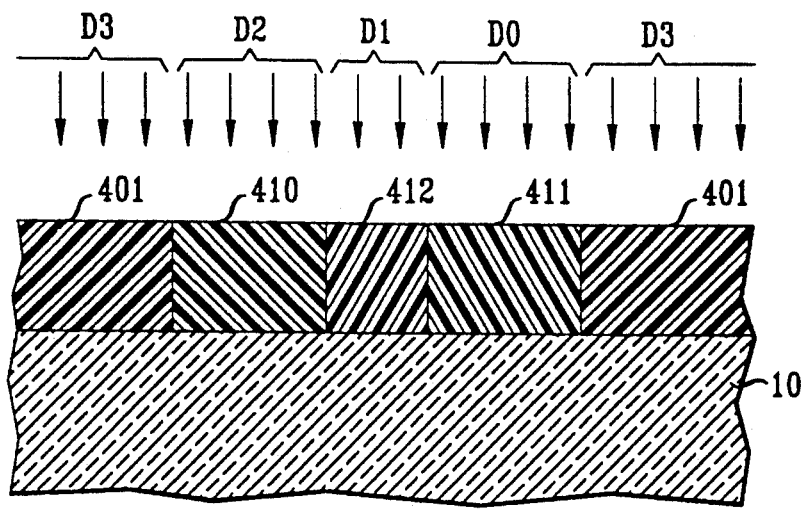
FIGS. 4–9 are elevational side views of a cross section of various successive stages in the fabrication of a phase-shifting mask in accordance with the first specific embodiment of the invention.

Referring now to FIG. 4, a slab 10 is made of a material, such as quartz, that is transparent to the optical wavelength $\lambda$ emitted by the source 106 (FIG. 1). This slab 10 has a top planar major surface on which is located a spun-on resist layer. This resist layer advantageously has a uniform thickness.

Figure 2:
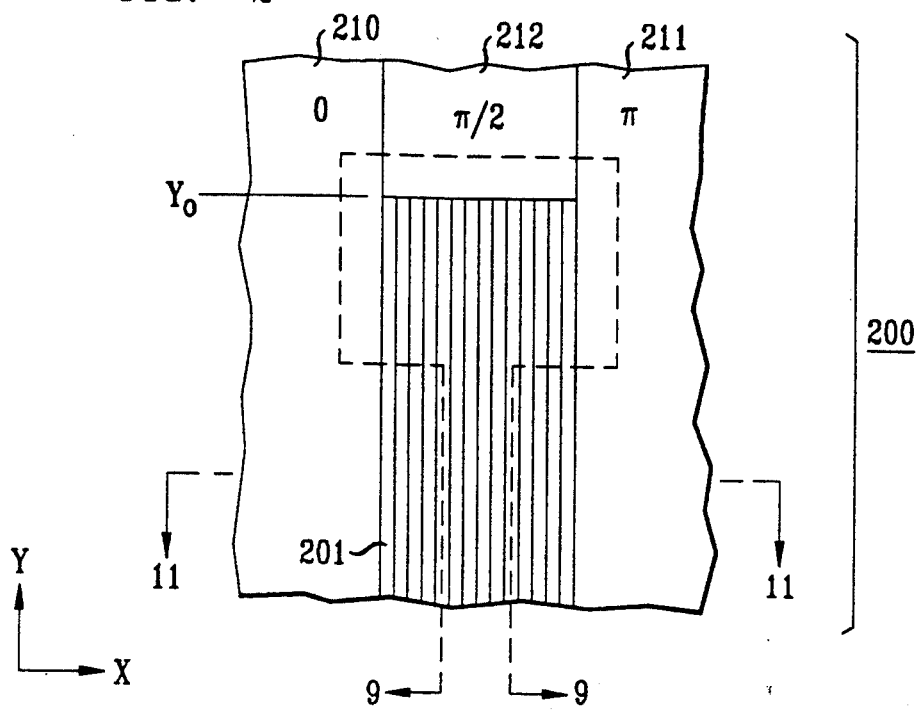
FIG. 2 is a top view diagram of a portion of a phase-shifting mask to be fabricated in accordance with a first specific embodiment of the invention.

Various regions 401, 410, 412, and 411 of the resist layer have been subjected to mutually different dose levels D3, D2, D1, and D0, respectively, of actinic radiation. These regions 401, 410, 412, and 411 advantageously have the same topology (top view) as the regions 201, 210, 211, and 212 (FIG. 2), respectively, taken along the section labeled 9—9 (FIG. 2).

Typically the resist layer is negative tone, such as a resist composed of a polymer, crosslinker, and an acid generator—for example, SAL601 sold by Shipley. The actinic radiation typically is an electron beam of 10 keV energy. The dose levels D3, D2, D1 and D0 in the regions 401, 410, 412, and 411 are monotonically decreasing (D3>D2>D1>D0) and are respectively dependent on the respective processing and development conditions, for example, the respective parameters of post-exposure baking and development. Typically the dose level D0 is essentially zero.

Figure 5:
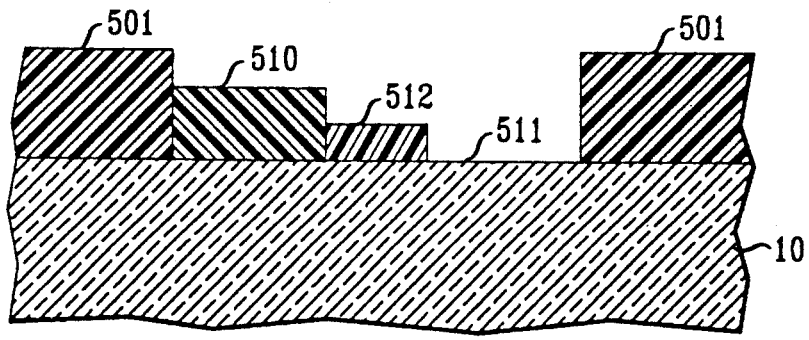

The resist layer is (FIG. 5) subjected to the wet development treatment, typically a wet development process—such as with a solution of ammonium hydroxide in water, typically in the approximate range of 0.2 to 0.3 normality—for a time interval that is sufficient to reduce the thickness of the region 411 advantageously essentially to zero, whereby a surface area 511 of the slab 10 becomes exposed. The duration of this time interval in general, of course, will depend on the nature and concentration of active components in the developing process. At the same time the thicknesses of resist regions 401, 410, and 412 are reduced, whereby remaining resist regions 501, 510, and 512, respectively, are formed—the thickness of resist region 401 being reduced very little, provided that the dose level D3 was sufficiently high, and the thicknesses of the remaining resist regions 501, 510, and 512 being monotonically decreasing.

Figure 6:
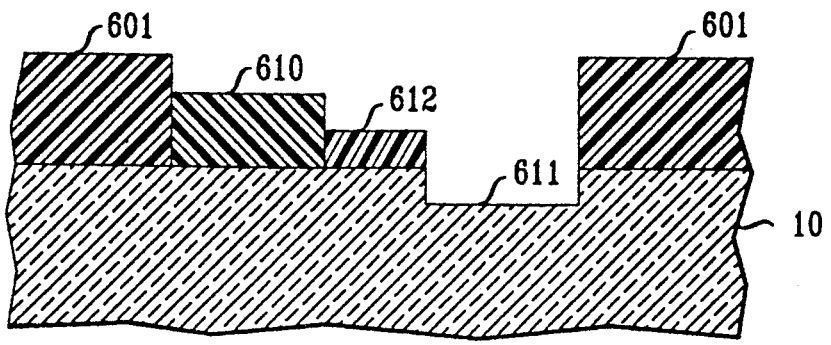

Next (FIG. 6), the remaining resist regions and the exposed surface area 511 of the slab 10 are subjected to a dry etching, typically with a fluorine-containing plasma such as provided by $CF_4$ or $CHF_3$ (or both), with or without $O_2$—whereby the exposed surface area 511 is etched down to exposed surface area 611 located at a depth beneath the original top surface of the slab 10 that is advantageously equivalent to a phase shift of $\pi/2$ with respect to the wavelength $\lambda$. At the same time, the resist regions 501, 510, and 512 respectively become resist regions 601, 610, and 612 with no significant changes in their respective thicknesses.

Figure 7:
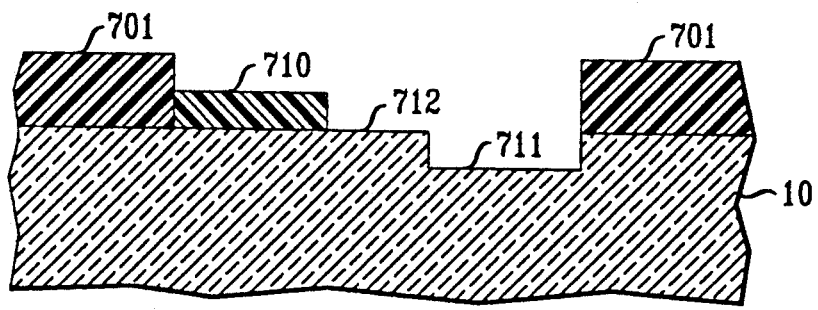

Next (FIG. 7), the remaining resist layer and the exposed areas of the slab are subjected to a dry etching treatment, such as with an oxygen plasma, which etches material of the resist but not significantly of the slab 10. This etching is performed for a time interval that is sufficient to reduce the thickness of the resist region 612 advantageously essentially to zero, whereby a surface area 712 of the slab 10 becomes exposed. The required duration of the this time interval, of course, will depend on the electrical and chemical parameters of the oxygen plasma. At the same time, the thicknesses of the resist regions 601 and 610 are reduced, whereby remaining resist regions 701 and 710, respectively, are formed—the thickness of the remaining region 701 being larger than that of the remaining region 710. Also, the exposed surface area 611 of the slab 10 becomes essentially the same exposed area 711—that is, with no significant change in depth beneath the original top surface of the slab 10; and the exposed surface area 712 is located flush with the original top surface of the slab 10.

Figure 8:
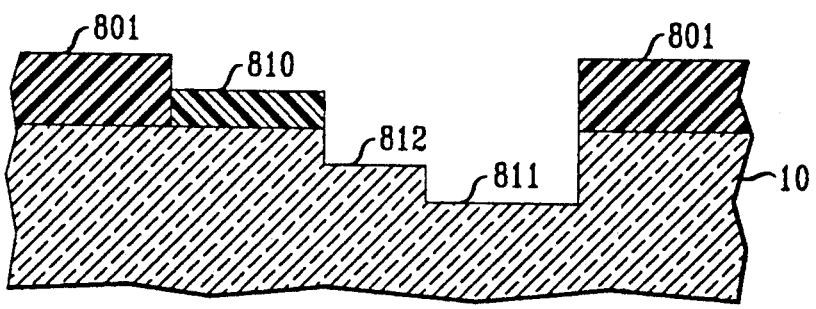

Next (FIG. 8) the remaining resist regions and the exposed surface areas 712 and 711 are subjected to a dry etching, again typically with a fluorine-containing plasma—whereby the surface areas 712 and 711 are etched down to exposed surface areas 812 and 811, respectively, located at depths beneath the original top surface of the slab 10 that are advantageously equivalent to phase shifts of $\pi/2$ and $\pi$, respectively. At the same time, the resist regions 701 and 710 become essentially the same resist regions 801 and 801, respectively—that is, with no changes in their respective thicknesses.

Figure 9:
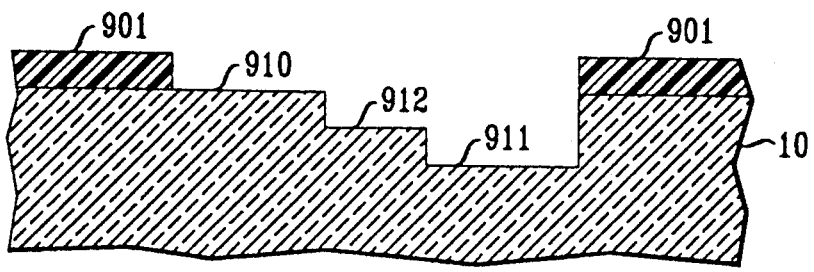

Next (FIG. 9) the remaining resist regions 801 and 810 and the exposed surface areas 812 and 811 of the slab 10 are subjected to a dry etching treatment, such as with an oxygen plasma. This etching is performed for a time interval that is sufficient to reduce to essentially zero the thickness of the resist region 810, to form an exposed area 910: that is, the surface area 910 of the slab becomes exposed and does not absorb any significant amount of light when the now-formed mask (FIG. 9) is used as the reticle in the system 100 (FIG. 1). At the same time, the exposed surface areas 812 and 811 become essentially the same respective exposed surface areas 912 and 911, with no significant changes in their respective depths beneath the original top surface of the slab 10. Finally, the resist region 910 is carbonized, as by heating to a temperature of typically approximately 200° C. for typically approximately one hour, in order to render it permanently opaque for use as the opaque region 201 (FIG. 2) in the mask 200.

Figure 10:
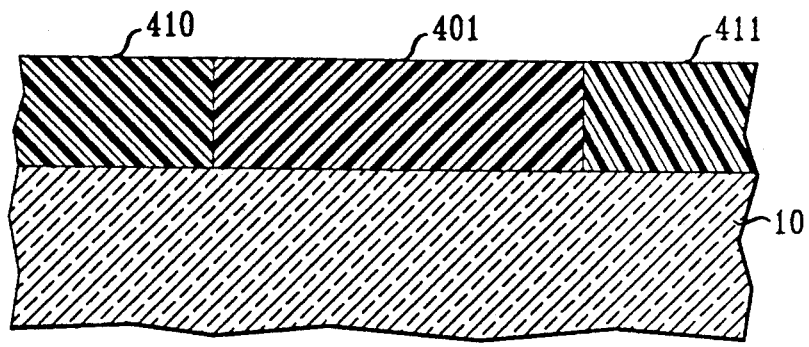
FIGS. 10–11 are elevational side views of another cross section of various successive stages in the fabrication of a phase-shifting mask in accordance with the second specific embodiment of the invention.
Figure 11:
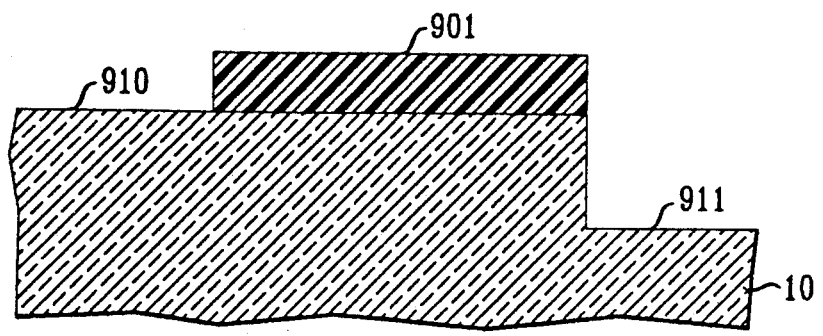

FIG. 10 indicates the situation corresponding to that indicated in FIG. 4, but taken along the section labeled 11—11 (FIG. 2). FIG. 11 indicates the situation corresponding to that indicated in FIG. 9, but again taken along the section labeled 11—11 (FIG. 2). In going from the situation depicted in FIG. 10 to that depicted in FIG. 11, the intermediate situations should be understood from the above description of the situation depicted in FIGS. 5-8. Furthermore, in case the situation depicted in FIG. 11 itself is desired, i.e., without any exposed area such as the exposed area 912 having an intermediate equivalent phase-shift, then one of the intermediate dose levels can be omitted, and hence only three regions of mutually different dose levels would be needed, in conjunction with one fewer resist reduction steps and one fewer body etching steps.

Figure 3:
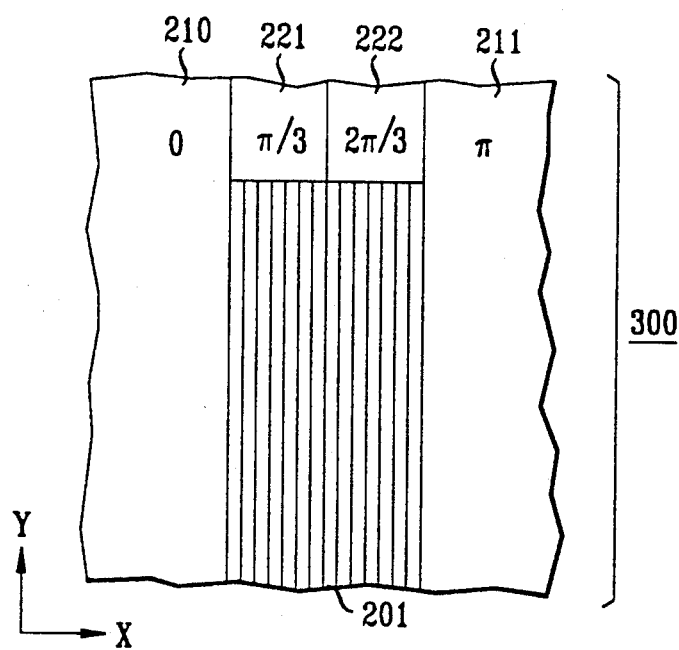
FIG. 3 is a top view diagram of a portion of another phase-shifting mask to be fabricated in accordance with a second specific embodiment of the invention.

Although the invention has been described in detail with respect to a specific embodiment, various modifications can be made without departing from the scope of the invention. For example, instead of negative tone, a positive tone resist can be used in conjunction with dose levels in regions 401, 410, 412, and 411, respectively, that are monotonically increasing. Also, simultaneous dry etching of resist and quartz with oxygen and fluorine-containing plasmas can be used and thus should be regarded as equivalent to the successive etchings of resist and quartz described above. Further, instead of carbonizing the remaining resist region 901, any remaining resist can be removed, while reliance for an opaque region thereat can be placed upon a diffraction grating (having zero intensity in its zero'th order) located thereat, in conjunction with one less required dose level of actinic radiation—that is, using three instead of four resist regions of mutually different dose levels (including zero), the required thickness of the resist region 901 being equal to essentially zero, and hence the required thicknesses of the resist regions 801 and 810 being equal. Alternatively, the topology depicted in FIG. 3 can be achieved by using four resist regions of mutually different dose levels of actinic radiation, in conjunction with the aforementioned diffraction grating, and with four suitable etching depths into the slab 10, namely, depths equivalent to 0, $\pi/3$, $2\pi/3$, and $\pi$ radian.

We claim:

1. A method of making a phase-shifting mask comprising the steps of
   a) introducing first, second, and third mutually different dose levels of actinic radiation into respective first, second, and third regions of an original resist layer, having a uniform composition and a uniform thickness, located on a planar surface of a body that is transparent with respect to optical radiation of a prescribed wavelength, whereby the first, second, and third regions have mutually different rates of thickness reduction during step (b);
   b) subjecting the original resist layer to a first treatment that reduces the thicknesses of the first, second, and third regions of the resist layer to mutually different amounts, and in particular that reduces the thickness of the first region to an amount that is less than those of the second and third regions;
   c) subjecting the remaining resist layer and a first region of the body that underlies the first region of the original resist layer to a second treatment that etches the first region of the body down to a predetermined depth beneath its planar surface.

2. The method recited in claim 1 followed by the step of
   d) subjecting the remaining resist layer to a third treatment that reduces the thickness of the remaining second region of the remaining resist layer to an amount that is less than that of the remaining third region of the remaining resist layer.

3. The method of claim 2 in which the remaining first region of the remaining resist layer has an essentially zero thickness immediately after the first treatment and in which the remaining second region of the remaining resist has an essentially zero thickness immediately after the third treatment.

4. The steps recited in claim 2 followed by the step of carbonizing the remaining third region of the remaining resist layer.

5. The method of claim 1 in which the first or third dose level is equal to essentially zero.

6. The method of claim 5 further comprising the steps of
   subjecting the remaining third region, if any, and the remaining fourth region of the remaining resist layer, the first and second regions of the body, and a third region of the body underlying the third region of the original resist layer to a sixth treatment that etches the first, second, and third regions of the body down to mutually different first, second, and third depths, respectively, beneath the major planar surface, and
   removing the remaining fourth region of the remaining resist layer.

7. A photolithographic method comprising the steps of:
   a) forming a phase-shifting mask in accordance with the steps recited in claim 1;
   b) directing optical radiation comprising the prescribed wavelength onto the phase-shifting mask, while focusing the radiation propagating through the phase-shifting mask onto a photoresist layer located on a workpiece, whereby an optical image of the mask is formed on the photoresist layer;
   c) developing the photoresist layer, whereby a feature is formed therein in accordance with the image of the mask; and
   d) transferring into the workpiece the feature in the photoresist layer.

8. The method of claim 1 in which the third region is contiguous with the first and second regions,
   in which the first or third dose level is equal to essentially zero, and
   in which the first, second, and third dose levels respectively are monotonically increasing or monotonically decreasing.

9. A photolithographic method comprising the steps of:
   a) forming a phase-shifting mask in accordance with claim 8;
   b) directing optical radiation comprising the prescribed wavelength onto the phase-shifting mask, while focusing the radiation propagating through the phase-shifting mask onto a photoresist layer located on a workpiece, whereby an optical image of the mask is formed on the photoresist layer;
   c) developing the photoresist layer, whereby a feature is formed therein in accordance with the image of the mask; and
   d) transferring into the workpiece the feature in the photoresist layer.

10. A method of making a phase-shifting mask comprising the steps of
    a) introducing first, second, third, and fourth mutually different dose levels of actinic radiation into first, second, third, and fourth regions, respectively, of an original resist layer, having a uniform composition and a uniform thickness, located on a planar top surface of a body that is transparent with respect to a prescribed wavelength, whereby the first, second, third, and fourth regions have mutually different rates of thickness reduction during step (b) herein;
    b) subjecting the resist layer to a first treatment that reduces the thicknesses of the first, second, third, and fourth regions of the original resist layer to mutually different amounts, and in particular that reduces the thickness of the first region to an amount that is less than those of the second, third, and fourth regions;
    c) subjecting the remaining resist layer and a first region of the body, underlying the first region of the original resist layer, to a second treatment that etches the first region of the body down to a predetermined depth beneath its planar surface;
    d) subjecting the remaining resist layer to a third treatment that reduces the thicknesses of the remaining second, third, and fourth regions of the remaining resist layer to mutually different amounts, and in particular that reduces the thickness of the remaining second region of the remaining resist layer to an amount that is less than those of the remaining third and fourth regions of the remaining resist layer;
    e) subjecting a second region of the body underlying the second region of the original resist layer, and the first region of the body, and the remaining resist layer to a fourth treatment that etches the first and second regions, respectively, of the body down to prescribed unequal respective depths beneath the major planar surface, no actinic radiation being introduced into the remaining resist layer subsequent to step (b).

11. The method of claim 10 further comprising, subsequent to step (e) therein, the step of subjecting the remaining resist layer to a fifth treatment that reduces the thickness of the remaining third region of the remaining resist layer to an amount that is less than that of the remaining fourth region of the remaining resist layer.

12. The method of claim 11 further comprising, subsequent to the fifth treatment, the step of subjecting the remaining resist layer, the first and second regions of the body, and a third region of the body underlying the third region of the original resist layer to a sixth treatment that etches the first, second, and third regions of the body down to mutually different depths beneath the major planar surface.

13. The method of claim 12 in which the first, third, and fifth treatments, respectively, reduce the thicknesses of the respective first, second, and third regions of the remaining resist layer essentially to zero.

14. The method of claim 11 further comprising the step of carbonizing the remaining fourth region of the remaining resist layer.

15. The method of claim 14 in which the first, third, and fifth treatments, respectively, reduce the thicknesses of the respective first, second, and third regions of the remaining resist layer essentially to zero.

16. A photolithographic method comprising the steps of:
a) forming a phase-shifting mask in accordance with the steps recited in claims 10;
b) directing optical radiation comprising the prescribed wavelength onto the phase-shifting mask, while focusing the radiation propagating through the phase-shifting mask onto a photoresist layer located on a workpiece, whereby an optical image of the mask is formed on the photoresist layer;
c) developing the photoresist layer, whereby a feature is formed therein in accordance with the image of the mask; and
d) transferring into the workpiece the feature in the photoresist layer.

17. The method of claims 10 in which the first or fourth dose level is equal to zero.

18. A photolithographic method comprising the steps of
a) forming a phase-shifting mask in accordance with claim 17;
b) directing optical radiation comprising the prescribed wavelength onto the phase-shifting mask, while focusing the radiation propagating through the phase-shifting mask onto a photoresist layer located on a workpiece, whereby an optical image of the mask is formed on the photoresist layer;
c) developing the photoresist layer, whereby a feature is formed therein in accordance with the image of the mask; and
d) transferring into the workpiece the feature in the photoresist layer.

19. The method of claim 10 in which
the first region of the original resist layer is contiguous with the second region thereof, the second region thereof is contiguous with the third region thereof, and the third region is contiguous with the fourth region thereof, and in which
the first or fourth dose level is equal to essentially zero.

20. The method of claim 19 in which the first, second, third, and fourth dose levels are monotonically decreasing or monotonically increasing, respectively.

21. A photolithographic method comprising the steps of
a) forming a phase-shifting mask in accordance with claim 19;
b) directing optical radiation comprising the prescribed wavelength onto the phase-shifting mask, while focusing the radiation propagating through the phase-shifting mask onto a photoresist layer located on a workpiece, whereby an optical image of the mask is formed on the photoresist layer;
c) developing the photoresist layer, whereby a feature is formed therein in accordance with the image of the mask; and
d) transferring into the workpiece the feature in the photoresist layer.

22. A method of making a phase-shifting mask comprising the steps of:
a) introducing first, second, and third mutually different dose levels of actinic radiation into respective first, second, and third regions of an original resist layer, having a uniform composition and a uniform thickness, located on a planar surface of a body that is transparent with respect to optical radiation of a prescribed wavelength, whereby the first, second, and third regions have mutually different rates of thickness reduction during step (b);
b) subjecting the original resist layer to a first treatment that reduces the thicknesses of the first, second, and third regions of the resist layer to mutually different amounts, and in particular that reduces the thickness of the first region to an amount that is less than those of the second and third regions;
c) subjecting the remaining resist layer and a first region of the body that underlies the first region of the original resist layer to a second treatment that etches the first region of the body down to a predetermined depth beneath its planar surface;
d) subjecting the remaining resist layer to a third treatment that reduces the thickness of the remaining second region of the remaining resist layer to an amount that is less than that of the remaining third region of the remaining resist layer; and
e) subjecting the remaining third region of the remaining resist layer and a second region of the body that underlies the second region of the resist layer to a fourth treatment that etches the first and second regions of the body to different predetermined first and second depths, respectively, beneath its planar surface, followed by the step of removing the remaining third region of the remaining resist layer.

* * * * *

UNITED STATES PATENT AND TRADEMARK OFFICE
CERTIFICATE OF CORRECTION

PATENT NO. : 5,308,721
DATED : May 3, 1994
INVENTOR(S) : J. G. Garofalo, et. al.

It is certified that error appears in the above-indentified patent and that said Letters Patent is hereby corrected as shown below:

Col. 11, line 36, "claims" should read --claim--; Col. 11, line 48, "claims" should read --claim--.

Signed and Sealed this

First Day of August, 1995

Attest:

BRUCE LEHMAN

Attesting Officer

Commissioner of Patents and Trademarks